United States Patent [19]

Taylor

[11] Patent Number: 5,433,260

[45] Date of Patent: Jul. 18, 1995

[54] SEALABLE ELECTRONICS PACKAGES AND METHODS OF PRODUCING AND SEALING SUCH PACKAGES

[75] Inventor: Edward A. Taylor, Roseburg, Oreg.

[73] Assignee: Pacific Coast Technologies, Inc., Wenatchee, Wash.

[21] Appl. No.: 253,240

[22] Filed: Jun. 2, 1994

Related U.S. Application Data

[62] Division of Ser. No. 919,873, Jul. 27, 1992, abandoned.

[51] Int. Cl.$^6$ .................... B22D 19/14; B22D 19/04
[52] U.S. Cl. ........................... 164/97; 164/98
[58] Field of Search ........................... 164/97, 98

[56] References Cited

U.S. PATENT DOCUMENTS

| | | | |
|---|---|---|---|
| 3,740,828 | 6/1973 | Buchinski | 29/470.1 |
| 4,371,588 | 2/1983 | Kyle | 428/448 |
| 4,493,378 | 1/1985 | Kyle | 174/152 |
| 4,507,522 | 3/1985 | Kyle | 174/152 |
| 4,649,229 | 4/1987 | Scherer | 174/52.4 |
| 4,657,337 | 4/1987 | Kyle | 174/152 |
| 4,690,480 | 9/1987 | Snow | 439/364 |
| 4,806,704 | 2/1989 | Belke | 174/52.4 |
| 4,841,101 | 6/1989 | Pollock | 174/152 GM |
| 4,934,952 | 6/1990 | Banker | 439/92 |
| 5,001,299 | 3/1991 | Hingorany | 174/52.4 |
| 5,041,019 | 8/1991 | Sharp et al. | 439/559 |
| 5,109,594 | 5/1992 | Sharp et al. | 29/600 |
| 5,110,307 | 5/1992 | Rapoza | 439/566 |
| 5,267,684 | 12/1993 | Catheline et al. | 174/152 GM |
| 5,298,683 | 3/1994 | Taylor . | |
| 5,311,920 | 5/1994 | Cook | 164/97 |

FOREIGN PATENT DOCUMENTS 9015664  8/1971  Japan ................ 174/152 GM

OTHER PUBLICATIONS

Explosive Fabricators, Inc., trade literature, "The Light Weight of Aluminum and the Seam Sealability of KOVAR", Microwave Journal, p. 141 (Feb. 1991).

Explosive Fabricators, Inc., trade literature, "The Most Powerful Name in Metal Fabrication Technology" (Jul. 1989).

Explosive Fabricators, Inc., trade literature, "EFTEK Explosion-Clad Materials for Power Hybrid and Microwave Packaging" (undated).

Primary Examiner—Kuang Y. Lin
Attorney, Agent, or Firm—Stoel Rives

[57] ABSTRACT

Apparatus and methods for hermetically sealing materials that cannot be satisfactorily sealed directly to one another using conventional techniques are disclosed. A laminar sheet material having adjacent bonded dissimilar metallic layers is interposed between elements being sealed. One of the metallic layers bonds metallurgically to one of the elements, while the other metallic layer is hermetically sealed to the other element using conventional techniques such as welding. The methods and apparatus of the present inventions are especially suitable for hermetically sealing metal matrix composite electronics packages.

22 Claims, 2 Drawing Sheets

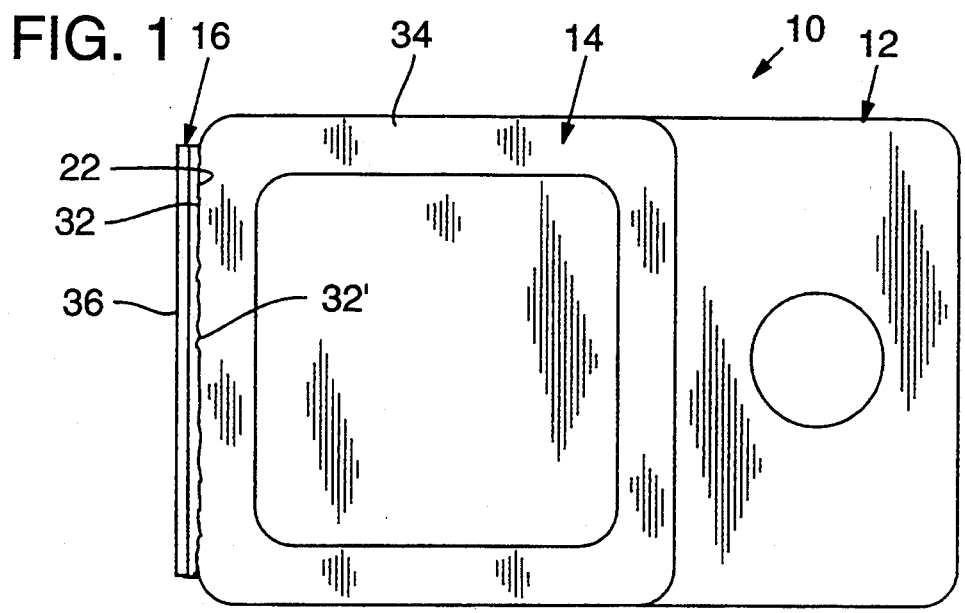
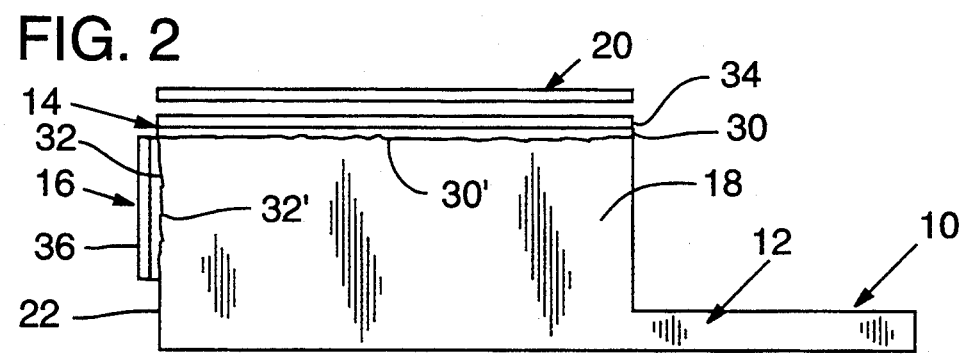
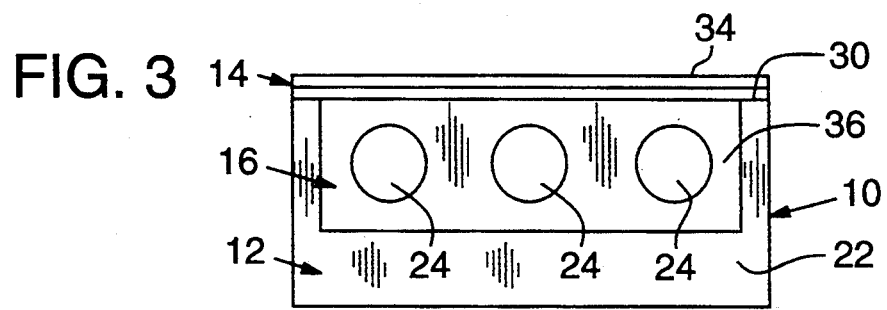

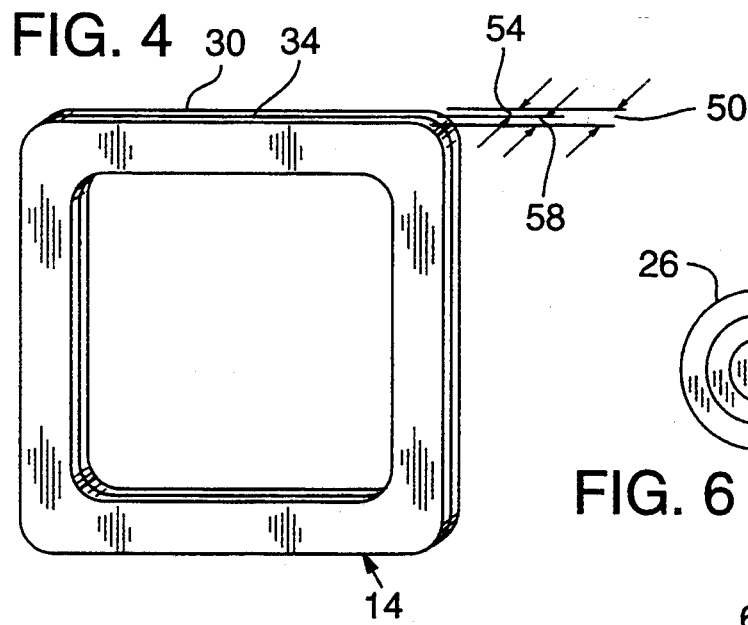
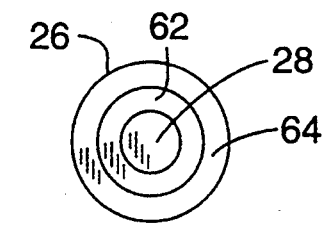
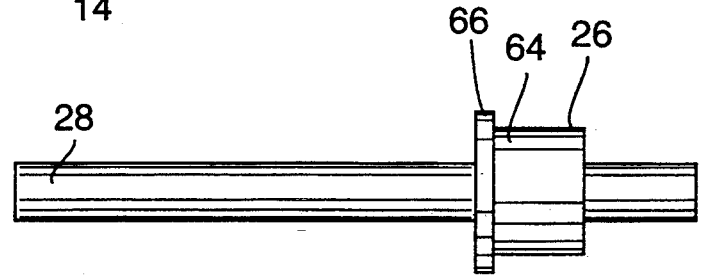
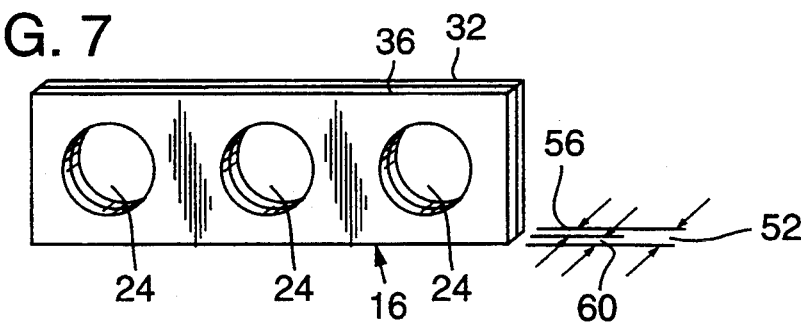
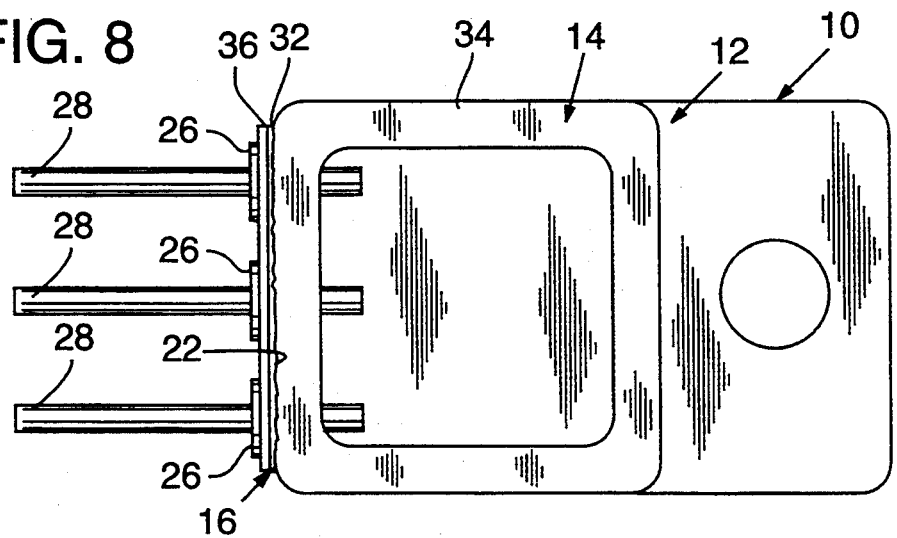

SEALABLE ELECTRONICS PACKAGES AND METHODS OF PRODUCING AND SEALING SUCH PACKAGES

This application is a divisional of U.S. application Ser. No. 07/919,873 filed Jul. 27, 1992, now abandoned.

TECHNICAL FIELD

The present invention relates generally to hermetically sealable packages constructed from materials such as metal matrix composites that are difficult to seal hermetically using conventional means, and to methods for producing and sealing such packages. The methods and hermetically sealable packages of the present invention are particularly suitable for electronics packaging applications.

BACKGROUND OF THE INVENTION

Modern electronic components are used in a wide variety of environments. Many electronic components are subject to corrosion resulting from environmental factors, such as water vapor. Such components are, therefore, typically sealed in dry nitrogen in an airtight package. Such packages typically comprise a box-like base, to which the electronic components are mounted. The sidewalls may be provided with feedthrough holes through which conductive pins are mounted to electrically connect electronic components inside the package to systems outside the package. Such pins are electrically insulated from and hermetically sealed to the package sidewall(s). After the electronic components are mounted in the package, a cover is hermetically sealed to the base along the upper rim of the sidewalls.

The materials composing the package are carefully selected to meet a number of application specific requirements for density, thermal expansion, thermal conductivity, and mechanical strength. For example, packages used on aircraft or spacecraft must be lightweight to preserve airworthiness, fuel efficiency, and maneuverability and, therefore, comprise low density materials. Packages used in high electric current applications should be constructed from materials having high thermal conductivity, so that heat generated within the package is conducted outside to maintain a lower temperature inside the package. The service life of components is generally enhanced when lower temperatures are maintained within the package.

Electronics packages should generally be constructed from materials having a thermal coefficient of expansion ("TCE") approximately equal to that of materials the packages contact. Otherwise, temperature changes produce stress and warping as the package and contacting materials expand and contract at different rates. Because electronic components are often mounted on low TCE ceramic chips inside the package, most electronic packaging applications require a material having a low TCE generally matching that of the ceramic chips. Packages made from ferrous alloys, such as Alloy 52 or KOVAR, have a low TCE but are relatively heavy. Packages made from aluminum are light in weight, but the TCE of aluminum is much higher than that of the ceramic chips.

In general, materials having a low density, low TCE, high thermal conductivity, and good mechanical strength are desirable for electronics packaging applications. One type of material that exhibits such desirable properties is a metal matrix composite ("MMC"). Such materials contain a non-metal reinforcing material dispersed within a metal matrix, or host material. The reinforcing material is typically in the form of fibers or particulates. The TCE, density, thermal conductivity, and mechanical strength can be manipulated by carefully selecting the matrix material and the form, percentage, and composition of the reinforcing material. For example, an aluminum alloy matrix with a silicon carbide particulate reinforcement has low density, low TCE, good thermal conductivity and satisfactory mechanical strength.

Metal matrix composite materials are well suited for electronics packaging applications. Difficulties have been encountered, however, in hermetically sealing the cover and feedthrough pins to MMC packages. Conventional non-MMC packages made from aluminum or ferrous alloys are typically sealed using a resistance welding process known as seam welding, or using laser welding. MMCs generally cannot be laser welded, however, because of the difference in energy absorption rates between the metal matrix material and the non-metal reinforcing material. Seam welding is generally unsuitable for non-ferrous materials such as aluminum.

Soldering or brazing a cover onto a package base tends to heat and expand the nitrogen in the package, inducing a partial vacuum within the sealed package as the nitrogen cools to room temperature. The vacuum causes structural stresses and can deform the package. Furthermore, the heat generated using soldering or brazing techniques to seal the cover to the package base raises the temperature inside the package, which can jeopardize the components housed within. None of the traditional sealing methods is thus suitable for hermetically sealing MMC electronics packages.

One solution for sealing a cover onto an aluminum matrix MMC package is to fabricate a package base in which the upper sidewall rims are free of the reinforcing material, as described in "Investment Cast Metal Matrix Composite," S. Kennerknecht, Society of Manufacturing Engineers Technical Paper EM90-441, 1990, available from the Society in Dearborn, Michigan. For example, an aluminum/silicon carbide base can be cast using a preform, i.e., a structure inserted into a mold to become part of the final casting, to form an upper rim of the base sidewalls comprising a different material, such as aluminum. A cover, preferably comprising aluminum, can then be laser welded to the aluminum rim.

Such a package comprising an MMC base with a metallic rim tends to warp upon cooling, however, as a consequence of the difference between the TCE of the MMC base material and that of the metallic rim. Although warpage of small packages can be corrected after cooling using an additional machining operation, the packages will tend to warp again as the temperature of the package fluctuates during operation. Therefore, this arrangement is useful only for very small packages in which the resulting warpage is minor enough to be acceptable. Larger component packages and packages with large length-to-width ratios tend to warp severely and thus cannot be successfully sealed using an unreinforced metallic preform.

In short, although materials such as MMCs that have physical properties meeting the requirements of electronics packaging applications are available, techniques for providing hermetically sealed MMC packages have not yet yielded satisfactory results.

An object of the invention is, therefore, to provide hermetically sealable electronics packages having desirable weight, thermal expansion, thermal conductivity, or mechanical strength properties suitable for a wide variety of applications.

Another object of the invention is to provide such electronics packages at competitive production costs.

A further object of the invention is to provide hermetically sealable electronics packages composed of an MMC material.

Yet another object of the invention is to provide a method for producing and hermetically sealing electronics packages made from a wide variety of materials, including MMCs.

SUMMARY OF THE INVENTION

The present invention provides apparatus and methods for hermetically sealing materials that cannot be sealed directly to one another using conventional techniques. In general, seal facilitating means of the present invention comprise a bonded laminar material having one surface that is bondable to a first component and another surface bondable to a second component or surface. The seal facilitating means thus provides a bonding surface that is hermetically sealable to each component desired to be bonded. Two components that cannot be sealed to one another directly can thus be hermetically sealed to one another using a seal facilitating means interposed between and bonded to the two sealing surfaces. The illustrative preferred embodiments described in detail below will be understood to be merely specific illustrative examples of the more general invention, and the invention will not be construed to be limited to the specific examples.

An illustrative preferred embodiment provides hermetically sealable and sealed electronics packages made from a wide variety of materials suitable for use in a variety of applications. Package base materials are chosen based upon the functional properties required for specific applications. Materials exhibiting low density, a low TCE, high thermal conductivity, and satisfactory mechanical strength are known in the art and are generally preferred for most electronics packaging applications. Although such materials have been available, it has previously been difficult to provide high quality, durable hermetically sealed packages made from many of these materials.

Packages of the present invention include a seal facilitating means that allows packages made from a wide variety of materials to be hermetically sealed. The seal facilitating means is constructed from a laminar metallic sheet material having adjacent bonded layers of dissimilar metals. Adjacent metallic layers are bonded using a technique such as explosive or frictional welding, and the bonded dissimilar metallic layers are rolled into sheets having various predetermined thicknesses. The laminar bonded metallic sheet may be cut into desired shapes for use as seal facilitating means. One layer of the laminar bonded metallic sheet comprises a material that is bondable to the package base, and another layer comprises a material that is bondable to the element being sealed, such as a package cover or a ferrule housing a feedthrough pin.

Electronics packages can be manufactured relatively inexpensively using existing techniques. Modern casting techniques, such as investment casting or pressure infiltration casting, can produce the package as a net shape casting, i.e., one that requires no additional machining or assembly operations after casting. The seal facilitating means may be incorporated into the package during a casting operation as a preform. Separate preforms for seal facilitating means can be mounted on the upper rim of the sidewalls of the package base for sealing to the cover, and on the end face of a package sidewall for sealing feedthrough pin(s). Thus, the package can be inexpensively manufactured with a minimum of joining and machining steps. The use of the laminar bonded metal seal facilitating means of the present invention allows sealing of packages composed of a wide variety of materials.

According to an especially preferred embodiment of a sealable electronics package of this invention, the package base is formed from an MMC material having an aluminum alloy matrix with silicon carbide particulate reinforcement. Seal facilitating means, each having a package base bonding layer comprising aluminum or an aluminum alloy and a sealing layer comprising a ferrous alloy, are inserted into the mold as preforms near the top rim of the base sidewalls and at outer faces of endwalls having conductive pin feedthrough holes. The mold is then filled with the MMC material to form the package base and, during casting, the aluminum-containing layer of each seal facilitating means melts and blends with the aluminum silicon carbide material of the package base as it solidifies in the mold to provide a metallurgical bond.

After the casting is removed from the mold and cleaned, the ferrous alloy side of each of the seal facilitating means is exposed for bonding with another component such as a cover, ferrule, or the like. The package cover may be made, for example, from a low TCE ferrous alloy and sealed directly to the ferrous alloy layer of the seal facilitating means. Ferrules comprising a ferrous sleeve surrounding a ceramic or glass insulating material can be hermetically sealed to the exposed ferrous side of the seal facilitating means in a similar manner. Because the sealing surfaces on the package, the cover and ferrule elements are constructed from ferrous materials, hermetic seals can be provided using conventional means, such as seam or laser welding.

Because the TCE of the ferrous metal of the seal facilitating means is similar to that of the MMC material, little or no stress is induced at the seal facilitating means as the package cools after the hermetic sealing operation. Such packages, therefore, do not warp upon cooling or as the temperature of the operating environment changes, as do prior art packages having unreinforced aluminum rims. Hermetically sealed electronics packages of the present invention also have satisfactory mechanical strength, good thermal conductivity, and are light in weight because a minimum amount of the heavier, low TCE ferrous material is required.

The methodology of the present invention is adaptable to hermetically seal a wide variety of materials that otherwise are not sealable to one another. Hermetically sealed electronics packages of the present invention may be employed in diverse environments to house electronics components of varying configurations. The electronics packaging aspect of the present invention is advantageous, for example, in microwave packaging, power packaging, solid state phased array radar packaging, hybrid packaging, hermetic connectors, and the like.

BRIEF DESCRIPTION OF THE DRAWINGS

Additional objects and advantages of the present invention will be apparent from the following detailed description of preferred embodiments, which proceeds with reference to the accompanying drawings, in which:

FIG. 1 is a plan view of an electronics package base including seal facilitating means for hermetically sealing a cover and one or more feedthrough pins according to a preferred embodiment of the present invention;

FIG. 2 is a side elevation view of the package base shown in FIG. 1, further illustrating a cover to be sealed to the sealing layer of the seal facilitating means;

FIG. 3 is an end elevation view of an electronics package base and seal facilitating means as shown in FIG. 1 having a plurality of feedthrough holes for housing feedthrough pins;

FIG. 4 is an isometric view of a seal facilitating means for sealing an electronics package cover to a package base as shown in FIG. 2;

FIG. 5 is a side elevation view of a conventional feedthrough pin and ferrule;

FIG. 6 is a front elevation of the conventional feedthrough pin and ferrule shown in FIG. 5;

FIG. 7 is an isometric drawing of a feedthrough pin and ferrule seal facilitating means for sealing ferrules housing feedthrough pins to a package base according to the present invention; and FIG. 8 is a plan view of an electronics package base with standard feedthrough pins housed in ferrules hermetically sealed to the package base according to methods of the present invention.

DETAILED DESCRIPTION OF PREFERRED EMBODIMENTS

The present invention is directed to methods for hermetically sealing materials that are not directly sealable to one another using a seal facilitating means comprising a laminar bonded sheet material, and to sealable and sealed apparatus produced according to these methods. FIGS. 1, 2, and 3 illustrate a plan view, side and end elevation views, respectively, of a hermetically sealable electronics package having a cover seal facilitating means 14 and feedthrough pin seal facilitating means 16 mounted on a package base. Electronics package base 10 is a generally box-like structure, open along one side, that is sized and configured to house and protect electronic components (not shown) and to provide an interface for the components to transmit and/or receive electronic signals. Package design criteria, such as dimensional constraints, aesthetic considerations, and the like, may impact the size and configuration of the electronics package. A standard configuration of the package base is illustrated, but the present invention may be adapted for use with a variety of package dimensions and configurations.

Package base 10 comprises a base member 12 having a plurality of upstanding sidewalls 18 forming a box-like structure open on one end or side to permit insertion and mounting of electronic components. The package base is preferably formed integrally as a one-piece structure.

Package base 10 is preferably made from a material having functional properties including a low TCE, high thermal conductivity, satisfactory mechanical strength, and light weight (i.e., low density). MMC materials are preferred for many electronics packaging applications. The particular MMC chosen depends upon the requirements of the specific application for which the package is intended. Metal matrix materials may include, for example, aluminum, copper, titanium, magnesium, zirconium, and alloys of those metals. Reinforcement material may include, for example, silicon carbide, graphite, or boron in fiber, particulate, or another form.

Although MMC materials are preferred for many electronics packaging applications, the invention is not limited to use with MMC materials. Other metallic materials made, for example, by metal injection molding two or more different metallic materials may also be useful for various applications. Such metal injection molded materials generally cannot be characterized as alloys, because the different metallic materials do not "mix" sufficiently. The seal facilitating means of the present invention is particularly suitable for sealing materials comprising at least two distinct materials, such as two distinct metals in metal injection molded materials, or metal matrix and reinforcement materials in MMC compositions.

A preferred MMC material for use in electronics packaging applications such as avionics, that require light weight materials, comprises a matrix of an aluminum alloy such as Al 6063 having silicon carbide particulate reinforcement. Aluminum silicon carbide MMC materials having from about 40 percent to about 60 percent and most preferably about 55 percent silicon carbide are preferred. The average particulate size of the reinforcement is generally about 25 microns. Such material is light weight, has a low TCE, good thermal conductivity, and satisfactory mechanical strength. Ingots of such castable MMC materials are commercially available. Preferred percentages of reinforcing material range from about 20 percent to about 70 percent. Silicon carbide reinforcement particulate size preferably ranges from about 10 to about 200 microns. In general, smaller reinforcement particle sizes are preferred for most applications. Other reinforcing materials, such as graphite and boron may also be used. A variety of aluminum and aluminum alloy MMC materials are known in the art and are suitable for electronics packaging applications. MMC materials comprising a copper alloy matrix and graphite fiber reinforcement have excellent thermal conductivity properties and are, therefore, preferred for electronics packaging applications involving power components that generate significant amounts of heat during operation. A variety of copper or copper alloy MMC materials are known in the art and are suitable for electronics packaging applications.

Seal facilitating means according to the present invention provide surfaces for hermetically sealing materials that otherwise would not seal to one another. Seal facilitating means 14 and 16 include base bonding layers 30 and 32, respectively, that are hermetically sealable to the package base and sealing layers 34 and 36, respectively, that are hermetically sealable to the cover and/or ferrules. Cover seal facilitating means 14 (FIG. 4) is bonded to package base 10 at an exposed (exterior) rim of sidewalls 18 (FIG. 2) to provide a surface for hermetically sealing cover 20 and package base 10. Likewise, feedthrough seal facilitating means 16 (FIG. 8) is bonded to an outer face 22 of a sidewall 18 having one or more feedthrough holes 24 to facilitate sealing a conventional ferrule 26 housing a feedthrough pin 28 (FIGS. 6 and 7) to package sidewall 18 in proximity to feedthrough hole(s) 24.

The seal facilitating means may be provided in a variety of configurations tailored to the requirements of various sealing environments. Cover seal facilitating means 14 are generally coextensive with the upper rim of sidewalls 18 and are preferably continuous around the perimeter of the box formed by the sidewalls. Because of the small amount of material necessary to form seal facilitating means 14 and 16, the weight of the seal facilitating means does not substantially increase the weight of electronics package 10. Although preferred embodiments of the invention are described with reference to hermetically sealing a cover and ferrules to an electronics package, it will be appreciated that a variety of components, including hermetic connectors, may be hermetically sealed to one another using seal facilitating means according to the present invention.

Seal facilitating means 14 and 16 are preferably fabricated from laminar dissimilar metallic sheets produced by explosive welding, friction welding, or other techniques for bonding dissimilar metals, with explosive welding being preferred. Laminar dissimilar metal sheets useful in the practice of the present invention are known and are commercially available from, for example, Explosive Fabricators Inc. (Louisville, Colo.) and Northwest Technical Industries, Inc. (Sequim, Wash.). Additional metallic or other layers may also be incorporated in the sheet material. After bonding, the composite dissimilar metallic sheet is rolled to a predetermined thickness and cut to the shape of seal facilitating means 14 and 16. Standard rolling and cutting processes may be employed for this purpose.

Base bonding layers 30 and 32 of the seal facilitating means 14 and 16, respectively, are composed of a material that is compatible with, and can be hermetically sealed with, one of the materials comprising package base 12. For applications wherein the package base comprises an MMC material, base bonding layers 30 and 32 preferably comprise the same material as the base metal material of the MMC package. Base bonding layers 30 and 32 do not necessarily match the TCE of the package base material. Base bonding layers 30 and 32 comprise materials that bond metallurgically with the package base material.

Sealing layers 34 and 36 are generally composed of materials having a TCE similar to that of the cover and ferrule materials, respectively, that can be hermetically sealed to package cover 20 and ferrule 26, respectively. It is not necessary in many cases, however, that the TCE of the ferrule(s) closely matches that of sealing layers 34 and 36. Additionally, sealing layers 34 and 36 preferably have TCEs similar to that of the package base material to reduce thermally induced stress in the sealed package. In general, it is necessary to match the TCEs of sealing layers 34 and 36, package covers 20 and package bases 10 more closely with larger packages that are more prone to thermal stresses.

The preferred composition of seal facilitating means 14 and 16 depends, of course, upon the composition of the materials being sealed—in the illustrative embodiments, the package base, cover and ferrules. According to preferred embodiments wherein the package base comprises an aluminum silicon carbide MMC material, base bonding layers 30 and 32 preferably comprise a material such as aluminum, aluminum alloy 4047, or aluminum alloy 6061, that is metallurgically compatible with and can be hermetically sealed to package base 12. Base bonding layers 30 and 32 preferably melt into and bond metallurgically with the material comprising the package base. Although base bonding layer boundaries are illustrated as interfaces 30' and 32' in FIG. 2, the material comprising base bonding layers 30 and 32 melts into the package base material to provide a metallurgical bond, and a bond boundary is not generally visible.

According to preferred embodiments wherein the cover and ferrules comprise a ferrous material, sealing layers 34 and 36 preferably comprise a ferrous material, such as Alloy 52, KOVAR, or another ferrous alloy that has a TCE similar to that of the cover, as well as package base 12, and can be hermetically sealed to cover 20 and ferrule 26. By providing ferrous metal sealing layers 34 and 36 for sealing to ferrous metal cover 20 and ferrule(s) 26, a hermetic seal can be formed using a conventional sealing process, such as seam welding. Hermetic sealing of electronics packages can thus be accomplished in a reliable manner without impairing the integrity of components mounted in the package. As mentioned previously, it is not necessary, in many cases, that the TCE of the ferrule match that of the sealing layer or the package base material. Standard stainless steel ferrules may therefore be based in accordance with the present invention.

Copper MMC materials are preferred to aluminum MMC materials for some electronics packaging applications. Preferred laminar dissimilar metallic layer materials for constructing seal facilitating means 14 and 16 for use with a copper matrix MMC package base 12 include copper and ferrous materials. Base bonding layers 30 and 32 preferably comprise a metal, such as copper or a copper alloy, that is metallurgically compatible with and bondable to the copper MMC package base 12. Preferred sealing layers 34 and 36 comprise a material such as Alloy 52, KOVAR, or other ferrous alloys, that has a TCE similar to that of the copper MMC package base 12 and can be hermetically sealed to ferrous cover 20, ferrule(s) 26, or other components to be sealed.

Additional metallic layers (not illustrated) may optionally be incorporated in the composite dissimilar metal sheet material forming seal facilitating means 14 and 16. For example, a layer of titanium, silver, palladium or the like may be interposed between the base bonding layers 30 and 32 and sealing layers 34 and 36, respectively, to prevent or reduce intermetallic growth between dissimilar metal sheet layers, e.g., KOVAR and 4047 or 6061 aluminum at elevated temperatures. An inert aluminum alloy, such as aluminum alloy 1100 or the like, may also be used for this purpose.

In general, the bonded laminar sheet material and, hence the seal facilitating means is relatively thin, providing an adequate surface area for bonding without contributing significantly to the weight and dimensions of the electronics package. The overall thicknesses 50 and 52 (FIGS. 4 and 7) of seal facilitating means 14 and 16, respectively, preferably range from about 0.010 in. to 0.100 in., with about 0.030 in. being preferred. Package base bonding layers 30 and 32 have thicknesses 54 and 56, respectively, of from about 0.005 in. to about 0.050 in., with about 0.015 in. being preferred, and sealing layers 34 and 36 have thicknesses 58 and 60, respectively, of from about 0.005 in. to about 0.050 in., with about 0.015 in. being preferred. The desired thickness of the bonded dissimilar metal sheet material and of each of the layers comprising the bonded sheet material depends largely upon the requirements of the sealing environment and the components being sealed.

It will be appreciated that although thicknesses 58 and 60 are illustrated as having the same magnitude, as are thicknesses 54 and 56, these thicknesses may be unequal in some embodiments. The desired thickness of one or more optional metallic layers (e.g., titanium or the like) that may be interposed between the base bonding layer and sealing layer of seal facilitating means 14 and 16 depends upon the materials, but may be expected to range from about 0.001 in. to about 0.010 in., with about 0.002 in. being preferred.

Electronics packages may be formed and assembled using a variety of technologies. A casting process, incorporating seal facilitating means 14 and 16 as preforms is generally preferred for forming package base 12, because it does not involve additional machining or joining steps. Investment casting is a preferred casting method for forming package bases comprising MMC materials reinforced with particulates, because complex structures can be formed with excellent dimensional accuracy and surface finish, at low cost. Pressure infiltration casting is a preferred method for forming a package base comprising a fiber reinforced MMC and may also be used for forming particulate reinforced MMC packages. Casting may generally be conducted using one of three techniques: top fill casting, bottom fill casting; or top pour casting. These casting techniques are described in detail in Cook and Werner, "Pressure Infiltration Casting of Metal Matrix Complexes," Jul. 17, 1991. Top fill casting, for example, includes the steps of loading the preform, loading the vessel, heating and evacuating the preform and vessel, filling the mold, pressurizing the vessel, controlled solidification, depressurization and unloading the molded product. Other methods, such as squeeze, die, and vacuum infiltration casting, can also be employed for forming package base 12.

During the casting operation, the molten metal poured into the mold contacts, melts and metallurgically bonds to base bonding layers 30 and 32 of seal facilitating means 14 and 16, respectively, which were inserted into the mold as preforms. Bonding layers 30 and 32 of seal facilitating means 14 and 16, respectively, thus are metallurgically bonded to base 12 without any additional joining operation. Sealing layers 34 and 36 are exposed and require no further treatment prior to bonding to cover 20 and ferrules 26, respectively, using conventional techniques such as seam welding.

Package cover 20, as shown in FIG. 2, comprises a ferrous metal surface that contacts and bonds to ferrous sealing layer 34 of cover seal facilitating means 14. The shape and dimensions of cover 20 are at least coextensive with the opening formed by base package sidewalls 18 and the configuration of seal facilitating means 14. Cover 20 is preferably constructed from a ferrous alloy having a TCE similar to that of the MMC material forming the package base and sealing layer 34. Because both sealing layer 34 and cover 20 comprise a ferrous material at the joint interface, standard seam or laser welding techniques may be employed to hermetically seal cover 20 to sealing layer 34, and thereby to package base 12.

FIGS. 5 and 6 show side and end elevations, respectively, of standard pin 28 sealed in ferrule 26 for electrically connecting components within electronics package 10 to systems outside of package 10. Ferrule 26 comprises an insulating portion 62 composed of a ceramic or glass material that surrounds and seals lead 28, and ferrous metal sleeve 64 having a lip 66 surrounding and sealing the insulating portion 62. Lip 66 also provides a surface for bonding ferrule 26 to sealing layer 36 of ferrule seal facilitating means 16. Because sealing layer 36 and lip 66 are both composed of a ferrous metal, the ferrule 26 can be hermetically sealed to sealing layer 36 of seal facilitating means 16 and, hence, package 10 using a conventional sealing process such as seam or laser welding. FIG. 8 illustrates a plurality of leads 28 mounted through ferrules 26 that are hermetically sealed to an electronics package base by means of seal facilitating means 16.

Known pre- and post-weld processes may be employed, if desired. For example, sealed electronics packages may be plating using techniques such as boron electroless nickel plating, low phosphorus nickel plating, electrolytic nickel plating, gold plating, silver plating, or the like. Pre- and post-weld processes are generally selected to provide electronics packages 10 having desirable properties in the anticipated environment.

One of the benefits of this invention is its applicability to sealing a wide variety of materials having a variety of configurations for diverse applications. The preferred embodiments disclosed herein relate to a particular type of electronics packaging, but the invention is applicable to a wide variety of electronics packaging and other types of hermetic sealing applications.

While in the foregoing specification this invention has been described in relation to certain preferred embodiments thereof, and many details have been set forth for purposes of illustration, it will be apparent to those skilled in the art that the invention is susceptible to additional embodiments and that certain of the details described herein may be varied considerably without departing from the basic principles of the invention.

I claim:

1. A method of producing a sealable electronics package, comprising:
    preforming at least one seal facilitating means including a laminate of two dissimilar materials; and
    bonding said seal facilitating means to an electronics package base during a casting operation thereby providing a sealing surface at which a hermetic seal to a component to be sealed is formable.

2. The method of claim 1 wherein said casting operation includes arranging said seal facilitating means in a mold and introducing a base material into said mold to form said electronics package base.

3. The method of claim 1 wherein said casting operation is accomplished by investment casting.

4. The method of claim 1 wherein said electronics package base is formed of a metal matrix composite.

5. The method of claim 4 wherein said metal matrix composite includes aluminum.

6. The method of claim 4 wherein said metal matrix composite includes copper.

7. The method of claim 4 wherein said metal matrix composite includes a carbide reinforcement.

8. The method of claim 1 wherein said seal facilitating means includes a base bonding layer capable of bonding to the electronics package base and a sealing layer to which said component to be sealed is sealable.

9. The method of claim 8 wherein said bonding layer is constructed of a material having a thermal coefficient of expansion which substantially matches that of the electronics package base.

10. The method of claim 1 wherein said laminate of two dissimilar materials comprises a layer including aluminum and a layer including iron.

11. The method of claim 1 wherein said laminate of two dissimilar materials comprises a layer including copper.

12. The method of claim 1 wherein said component to be sealed comprises a cover.

13. The method of claim 1 wherein said component to be sealed comprises a pin.

14. The method of claim 13 wherein a portion of said pin is housed in a ferrule.

15. A method of producing a sealable electronics package, comprising:
   providing a seal facilitating means that includes a bonded laminate having a first surface that is bondable to a first component and a second surface that is bondable to a second component;
   constructing a mold to form said first component by a casting operation, said mold including said seal facilitating means as a preform;
   filling said mold with a molten material that forms said first component; and
   causing a metallurgical bond between said first surface of said laminate and said first component so as to present said second surface of said laminate for bonding to said second component.

16. The method of claim 15 wherein said second surface of said laminate and said second component are constructed of metallurgically compatible materials for bonding, and further comprising forming a hermetic seal for said electronics package by bonding said second surface of said laminate to said second component.

17. The method of claim 15 wherein said first component comprises a metal matrix composite material.

18. The method of claim 17 wherein said metal matrix composite includes a material selected from the group consisting essentially of aluminum and copper.

19. The method of claim 15 wherein each of said first surface of said laminate and said first component includes a material selected from the group consisting essentially of aluminum and copper.

20. The method of claim 15 wherein said second surface of said laminate and said second component are constructed from ferrous materials.

21. The method of claim 15 wherein said second component comprises a cover.

22. The method of claim 15 wherein said second component comprises a pin.

* * * * *